United States Patent [19]

Miyaake et al.

[11] Patent Number: 6,001,489
[45] Date of Patent: Dec. 14, 1999

[54] FLEXIBLE PRINTED CIRCUIT AND PROCESS FOR PRODUCING THE SAME

[75] Inventors: Chiharu Miyaake; Yosuke Miki; Toshihiko Sugimoto, all of Osaka, Japan

[73] Assignee: Nitto Denko Corporation, Osaka, Japan

[21] Appl. No.: 08/998,388

[22] Filed: Dec. 24, 1997

[30] Foreign Application Priority Data

Dec. 25, 1996 [JP] Japan ..................................... 8-345735
Feb. 28, 1997 [JP] Japan ..................................... 9-046063

[51] Int. Cl.$^6$ ..................................................... B32B 15/08
[52] U.S. Cl. ........................... 428/458; 428/418; 428/901; 174/254; 174/258
[58] Field of Search .................... 428/901, 209, 428/458, 418; 174/254, 258

[56] References Cited

U.S. PATENT DOCUMENTS

| | | | |
|---|---|---|---|
| 4,592,623 | 6/1986 | Yamamoto et al. | 427/163.1 |
| 4,719,495 | 1/1988 | Ohuchi et al. | 355/100 |
| 5,700,562 | 12/1997 | Sugimoto et al. | 428/327 |
| 5,814,393 | 9/1998 | Miyaake et al. | 428/209 |

*Primary Examiner*—Deborah Jones
*Assistant Examiner*—Cathy F. Lam
*Attorney, Agent, or Firm*—Sughrue, Mion, Zinn, Macpeak & Seas, PLLC

[57] ABSTRACT

A flexible printed circuit comprising a plastic film and a conducting layer, wherein the plastic film exhibits a heat shrinkage rate ellipse having an eccentricity of not more than 0.7 and preferably exhibits an ultrasonic wave propagation rate ellipse having an eccentricity of not more than 0.4 and a polarized microwave transmission intensity ellipse having an eccentricity of not more than 0.55. The flexible printed circuit has improved dimensional accuracy owing to the dimensional stability of the plastic film.

9 Claims, 7 Drawing Sheets

HEAT SHRINKAGE RATE ELLIPSE

ULTRASONIC WAVE PROPAGATION RATE ELLIPSE

REFERENCE AXIS

— ANALYTICAL ELLIPSE
a  MAJOR AXIS RADIUS
b  MINOR AXIS RADIUS

POLARIZED MICROWAVE
TRANSMISSION INTENSITY ELLIPSE

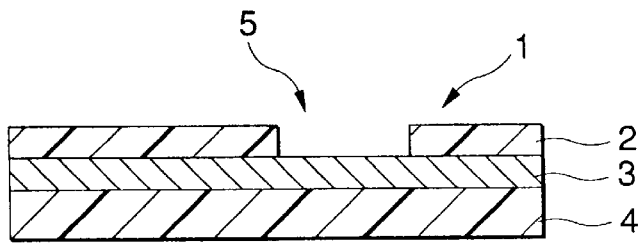
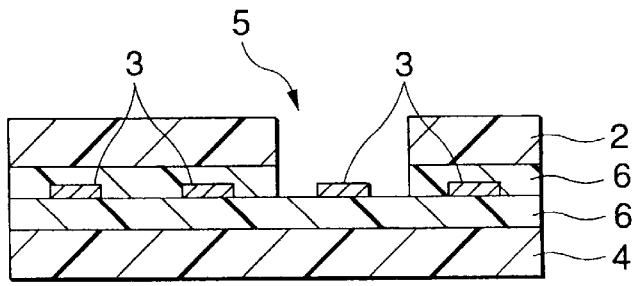
FIG. 6(A)
FIG. 6(B)
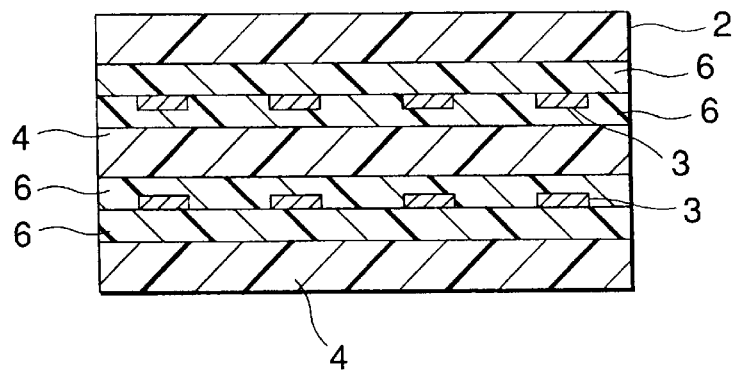
FIG. 6(C)
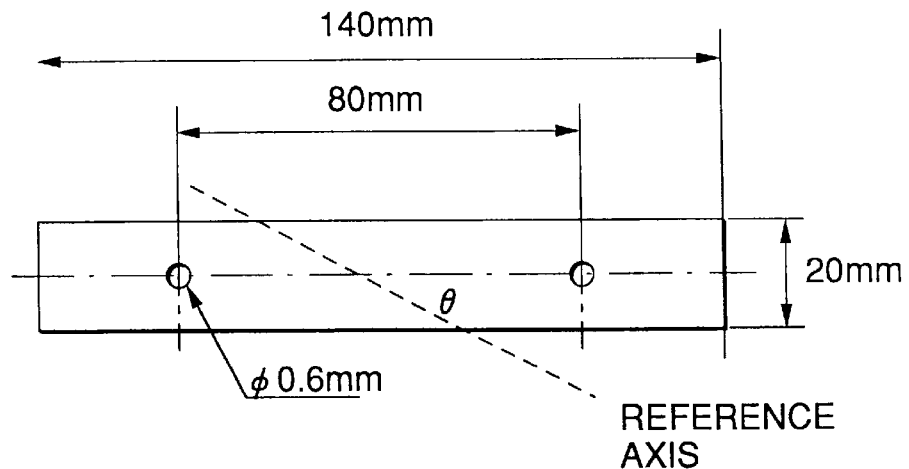
FIG. 7

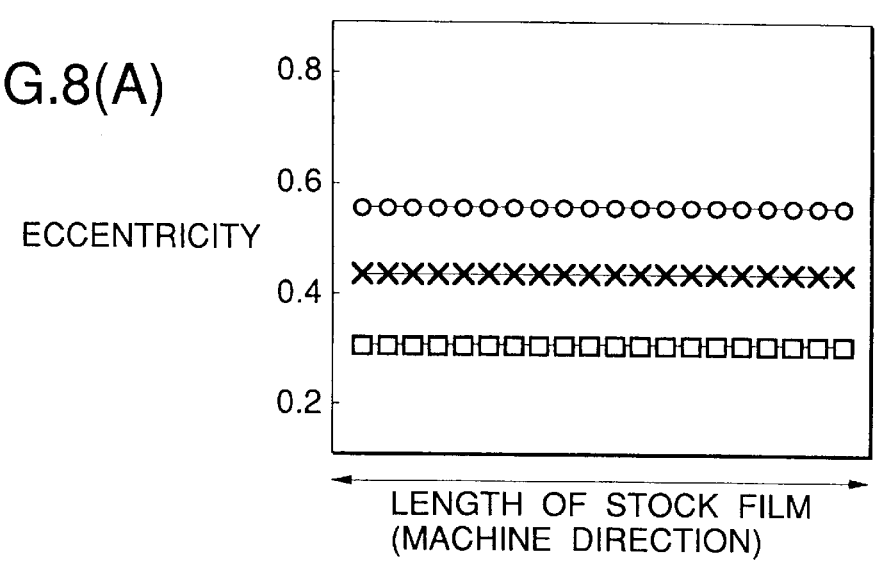

FIG.8(A)

LENGTH OF STOCK FILM (MACHINE DIRECTION)

o : ECCENTRICITY OF HEAT SHRINKAGE RATE ELLIPSE

□ : ECCENTRICITY OF ULTRASONIC WAVE PROPAGATION RATE ELLIPSE

× : ECCENTRICITY OF POLARIZED MICROWAVE TRANSMISSION INTENSITY ELLIPSE

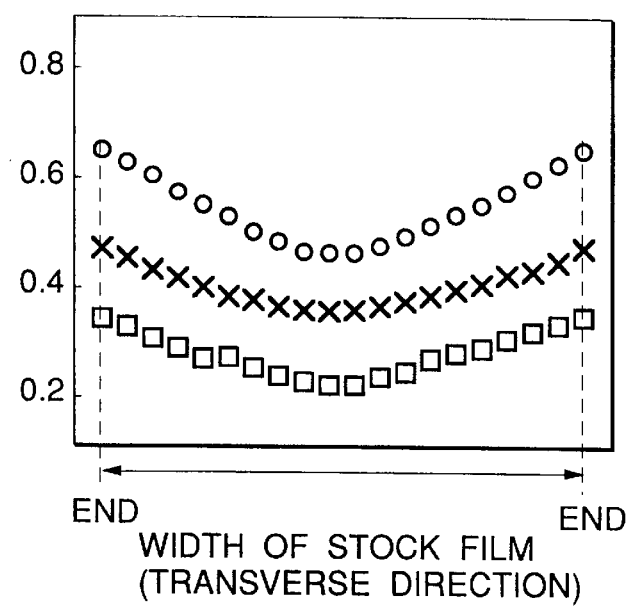

FIG.8(B)

WIDTH OF STOCK FILM (TRANSVERSE DIRECTION)

o : ECCENTRICITY OF HEAT SHRINKAGE RATE ELLIPSE

□ : ECCENTRICITY OF ULTRASONIC WAVE PROPAGATION RATE ELLIPSE

× : ECCENTRICITY OF POLARIZED MICROWAVE TRANSMISSION INTENSITY ELLIPSE

FLEXIBLE PRINTED CIRCUIT AND PROCESS FOR PRODUCING THE SAME

BACKGROUND OF THE INVENTION

1. Field of the Invention

This invention relates to a flexible printed circuit that is a functional component used chiefly in electric and electronic equipments and a process for producing the same.

2. Description of the Conventional Art

A flexible printed circuit (FPC) has enjoyed wide use in the field of electric and electronic equipment. A flexible printed circuit generally has a laminate structure comprising a plastic film and a conducting layer, such as a metal foil. An illustrative example of the flexible printed circuit is shown in FIG. 6(A), in which a flexible printed circuit 1 comprises a plastic base film 4 made of polyimide, polyester, etc. having formed thereon a conductor circuit 3 by a printing process, a subtracting process, etc., and the conductor circuit 3 is covered with a plastic cover film 2 similar to the base film 4. Incidentally, the adhesive layers are omitted in FIG. 6(A).

FIG. 6(B) shows a general structure of the flexible printed circuit. In FIG. 6(B), an adhesive layer 6 is provided on a plastic base film 4 via which a conductor circuit 3 is laminated, and another adhesive layer 6 is also provided on the side of the plastic cover film 2. That is, the plastic films 2 and 4 are bonded together with their respective adhesive layers facing each other. Further, part of the plastic cover film 2 can be removed (indicated by numeral 5 in FIGS. 6(A) and 6(B)) if necessary for electrical connection of the conductor circuit 3 to other electronic components.

Flexible printed circuits are required to have dimensional accuracy because electronic components such as semiconductor devices are to be mounted thereon at small pitches or they are to be connected to electronic equipment via connectors, etc. at small pitches. Since a flexible printed circuit has a laminate structure comprising plastic films and a conducting layer as typically shown in FIGS. 6(A) to (C), their dimensional accuracy largely depends on the dimensional stability of the plastic films used. The plastic films for use in the flexible printed circuit are therefore required to have dimensional stability, particularly against heat because they are usually handled under a high temperature condition in the manufacture of flexible printed circuits.

It is necessary to select plastic films having satisfactory dimensional stability before a flexible printed circuit with improved dimensional accuracy can be produced. Close evaluation on the dimensional stability of plastic films would be essential therefor.

However, in the practice of manufacture of flexible printed circuits using conventional plastic films, dimensional change of the plastic films with heat has often resulted in production of off-specification products, leading to faulty electrical connections between the flexible printed circuit and other electronic components such as connectors.

SUMMARY OF THE INVENTION

An object of the present invention is to provide a flexible printed circuit having improved dimensional accuracy by using a plastic film with improved dimensional stability particularly against heat.

Another object of the invention is to provide a process for producing a flexible printed circuit having improved dimensional accuracy.

The above objects of the present invention are accomplished by a process for producing a flexible printed circuit comprising laminating a plastic film and a conducting layer, wherein the plastic film exhibits a heat shrinkage rate ellipse having an eccentricity of not more than 0.7.

BRIEF DESCRIPTION OF THE DRAWINGS

In the accompanying drawings:

FIGS. 4(A) to 4(D) illustrate cross sections showing the process for producing a flexible printed circuit, in which FIG. 4(A) is a plastic base film having thereon a copper foil via an adhesive layer, FIG. 4(B) is the plastic base film with its copper foil patterned into a circuit, FIG. 4(C) shows a plastic cover film being laminated on the base film, and FIG. 4(D) is a finished flexible printed circuit;

FIGS. 6(A) to 6(C) illustrate cross sections of flexible printed circuits, in which FIG. 6(A) is a basic structure, FIG. 6(B) is a structure containing two plastic films each having an adhesive layer thereon, and FIG. 6(C) is a structure containing three plastic films each having an adhesive layer thereon;

FIG. 7 shows the size of a test piece of a plastic film for measurement of heat shrinkage rates;

FIGS. 8(A) and 8(B) show changes in eccentricity of the heat shrinkage rate ellipse, the ultrasonic wave propagation rate ellipse, and the polarized microwave transmission intensity ellipse of a biaxially stretched plastic film respectively in the machine direction and in the transverse direction.

DETAILED DESCRIPTION OF THE PREFERRED EMBODIMENTS

Figure 4A:
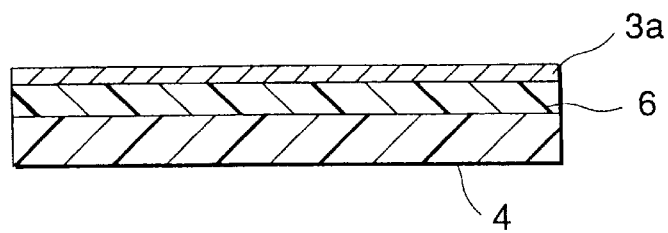
Figure 4B:
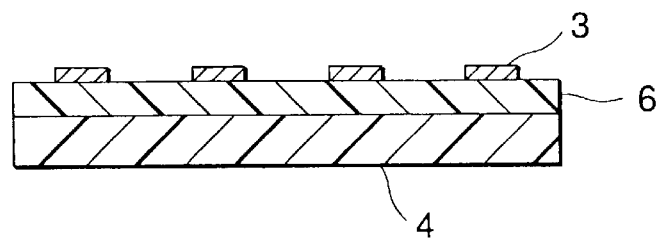

The flexible printed circuit included under the scope of the invention has a laminate structure of a conducting layer and one plastic film as shown in FIG. 4(B), two plastic films as shown in FIG. 6(B), three plastic films as shown in FIG. 6(C) or even more. The term "flexible printed circuit", as used herein is intended to include not only a flexible printed circuit with its conducting layer patterned into a circuit as is usually meant but a laminate board before formation of a circuit pattern.

The ellipse heat shrinkage rates of a plastic film can be depicted on polar coordinates according to the following method.

A reference axis is drawn on the surface of a stretched plastic film in the stretching direction. A reference point P is arbitrarily set on the axis, and the heat shrinkage rate of the film in the direction forming an angle θ with the axis from the reference point P is measured. Taking the measured value of heat shrinkage rate as a distance r from the point P, the distance r is plotted on the direction of the angle θ. Measurement and plotting are repeated at varied angles θ. The averages of plots at each angle are connected to draw an analytical ellipse round the reference point P. In the case of examining an unstretched film, the reference axis is set arbitrarily.

The heat shrinkage rate is measured as follows. A test piece of a plastic film is marked with two reference points. After a heat and tensile load of 130° C.×1 kg/mm$^2$ was applied to the test piece for 1 minute, the distance between the reference points ($L_1$) is measured to the unit of μm. Then, the film is heated at 150° C. for 1 hour with no tensile load applied, and the distance between the reference points ($L_2$) is measured to the unit of μm. The heat shrinkage rate (R; %) is obtained according to equation (1):

$$R=(L_1-L_2)/L_1 \times 100 \tag{1}$$

The test piece of a plastic film used for measurement of heat shrinkage rates can have the shape shown in FIG. 7. The test piece of FIG. 7 is 140 mm in length and 20 mm in transverse and marked with two reference points (a center of a hole having a diameter of 0.6 mm each) at a distance of 80 mm.

In general, an eccentricity (ε) of an ellipse is given through equation (2):

$$\epsilon=(a^2-b^2)^{1/2}/a \tag{2}$$

wherein a is the major axis radius, and b is the minor axis radius.

The flexible printed circuit according to the present invention is produced by laminating at least one plastic film and a conducting layer. The eccentricity of the heat shrinkage rate ellipse of plastic films to be used is usually measured before laminating. Because the eccentricity is hardly affected by laminating, the measurement could be made on a plastic film stripped off a flexible printed circuit produced.

The technical idea of the present invention is explained below. In order to settle the dimensional accuracy problem of a flexible printed circuit, the inventors extensively investigated the cause of the dimensional defect. As a result, they have found out that the dimensional defect is caused by the in-plane anisotropy of heat shrinkage rate of the plastic film. Considering that plastic films are exposed in high temperatures in an ordinary manufacturing process of flexible printed circuits, it could be easily anticipated that the degree of heat shrinkage of a plastic film is directly concerned in the dimensional stability of the film. It has now been found that not only the degree of heat shrinkage but the directionality of heat shrinkage, i.e., in-plane anisotropy of heat shrinkage should be given adequate consideration in order to prevent a faulty connection of a flexible printed circuit, particularly one having a dense and fine conductor circuit pattern.

Biaxially stretched films are often used in the flexible printed circuit. When biaxial stretching conditions are slightly changed, the anisotropy of heat shrinkage rate tends to vary depending an the position of measurement. Therefore, in using a biaxially stretched film, anisotropy of heat shrinkage rate requires due consideration.

The inventors have evaluated the in-plane anisotropy of heat shrinkage rate of a plastic film in terms of eccentricity of the heat shrinkage rate ellipse depicted by the above method. In this case, the greater the eccentricity, the greater the anisotropy, and vice versa.

Figure 1:
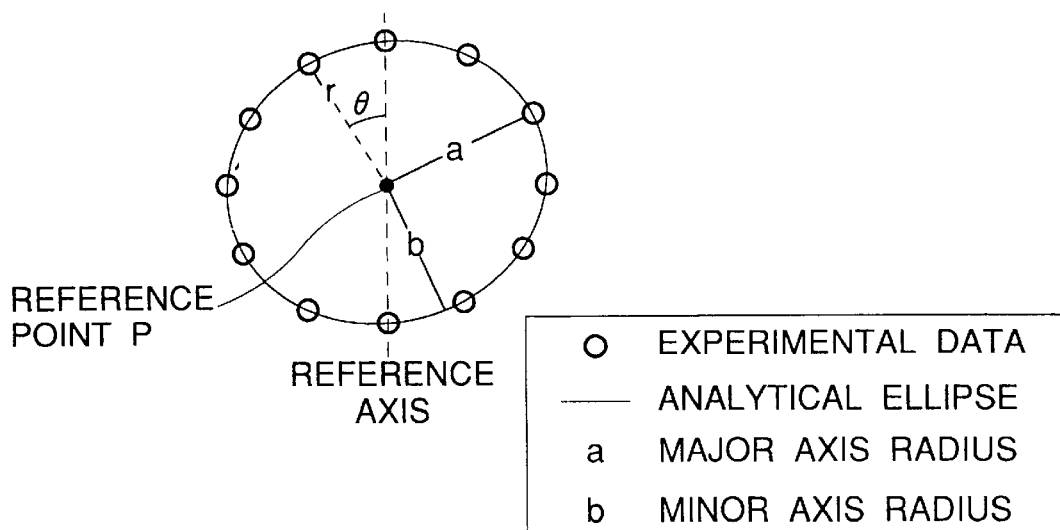
FIG. 1 illustrates the plot on polar coordinates depicting a heat shrinkage rate ellipse of a plastic film.

An example of such a heat shrinkage rate ellipse is shown in FIG. 1. "θ", is an angle formed between a reference axis and the direction in which a heat shrinkage rate is measured. "r" is a heat shrinkage rate, plotted as a distance from the reference point P (indicated by hollow circles).

When the eccentricity of the heat shrinkage rate ellipse is 0.7 or smaller, preferably 0.6 or smaller, the resulting flexible printed circuit exhibits satisfactory dimensional accuracy, and occurrence of faulty connections to other electronic components such as connectors is effectively inhibited.

To the contrary, if a plastic film having the eccentricity exceeding 0.7 is used, the resulting flexible printed circuit has poor dimensional accuracy, causing faulty connections at a considerable frequency due to large in-plane variations of heat shrinkage rate.

In the present invention, a heat shrinkage rate of a plastic film can be determined relatively by measuring a characteristic value deeply correlated to the heat shrinkage rate of a plastic film. Accordingly, the in-line anisotropy of heat shrinkage rate of a plastic film can be evaluated by the eccentricity of an ellipse prepared by using such a characteristic value in the same manner as described above.

Characteristic values which are deeply correlated with a heat shrinkage rate and from which a heat shrinkage rate can be determined relatively include a rate of in-plane propagation of ultrasonic waves (hereinafter referred to as ultrasonic wave propagation rate), an intensity of transmitted polarized microwave (hereinafter referred to as polarized microwave transmission intensity), and a Young's modulus. An ultrasonic wave propagation rate and a polarized microwave transmission intensity are preferred for the sake of convenience of measurement.

The term "ultrasonic wave propagation rate" as used herein means the time (sec) required for ultrasonic pulses (frequency: 25 kHz) to propagate through a plastic film for a distance of 75 mm at 2±2° C. or the rate of propagation (m/sec) calculated therefrom. The ultrasonic wave propagation rate can be measured easily and in a short time by means of Sonic Sheet Tester (SST) available from Nomura Shoji K.K.

Figure 2:
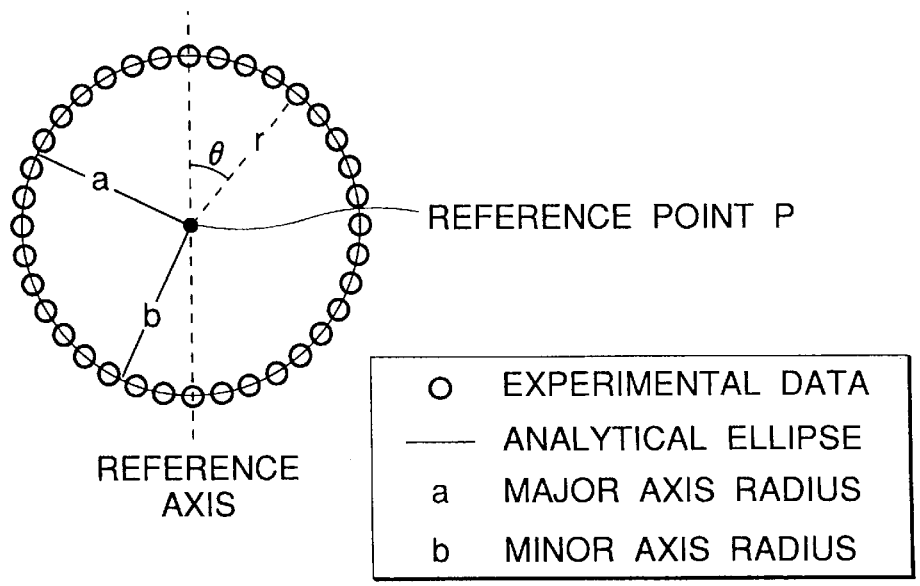
FIG. 2 illustrates the plot on polar coordinates depicting an ultrasonic wave propagation rate of a plastic film.

Similarly to the heat shrinkage rate ellipse of FIG. 1, the ultrasonic wave propagation rate ellipse is drawn on polar coordinates in accordance with the following method, an example of which is shown in FIG. 2.

A reference point P is arbitrarily set on the surface of a plastic film, and a reference axis passing through reference point P is drawn in an arbitrary direction. An ultrasonic wave propagation rate in the direction forming an angle θ with the axis from the reference point P is measured. Taking the measured value as a distance r from the point P, the distance r is plotted on the direction of the angle θ. Measurement and plotting are repeated at varied angles θ. The averages of plots at each angle are connected to draw an analytical ellipse round the reference point P.

When the eccentricity of the ultrasonic wave propagation rate ellipse is 0.4 or smaller, preferably 0.3 or smaller, the resulting flexible printed circuit exhibits satisfactory dimensional accuracy, and a faulty connection to other electronic components such as connectors is effectively prevented from occurring.

To the contrary, if a plastic film having the eccentricity exceeding 0.4 is used in a flexible printed circuit, the film has a large in-plane variation in heat shrinkage rate so that the resulting flexible printed circuit has poor dimensional accuracy, causing faulty connections at a high frequency.

Figure 9:
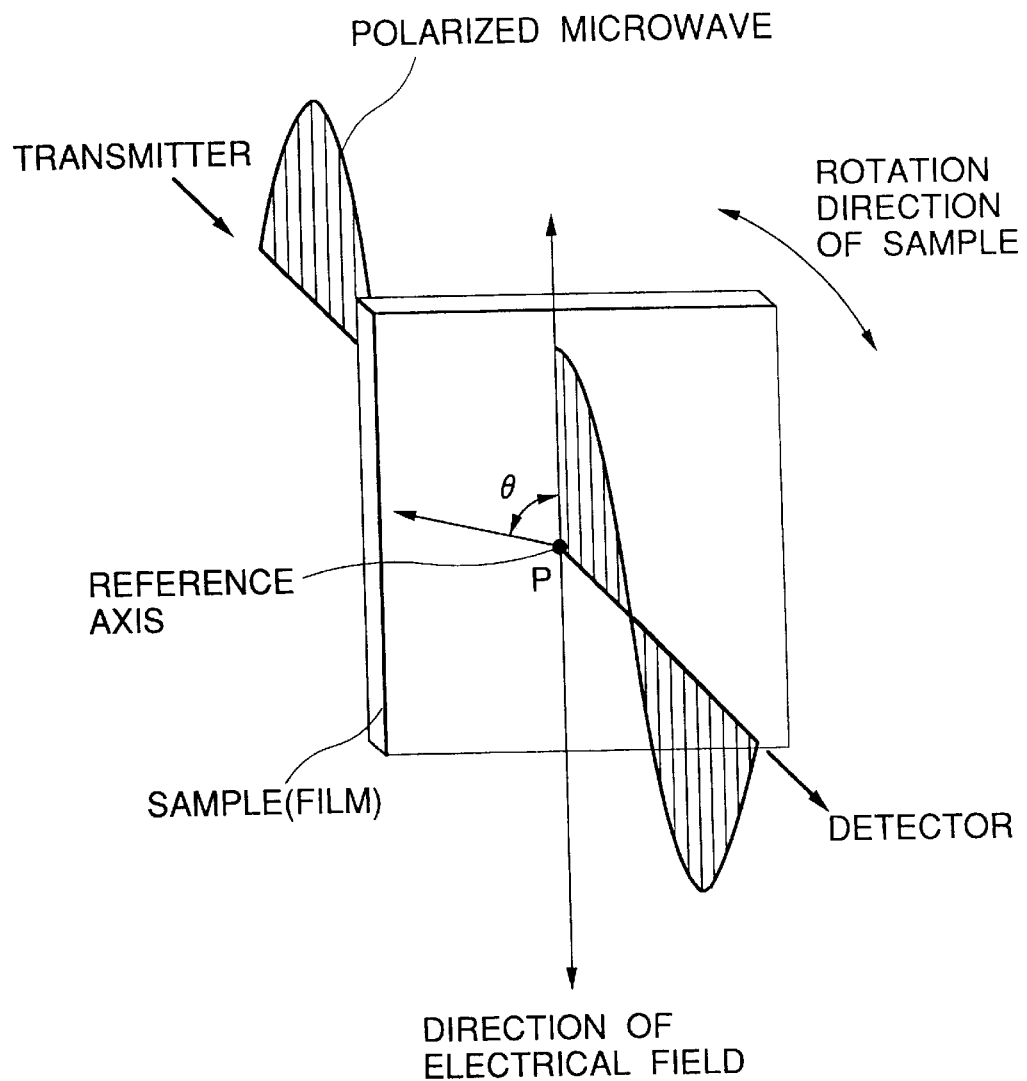
FIG. 9 schematically shows polarized microwaves being transmitted through a plastic film in the measurement of polarized microwave transmission intensities.

The term "polarized microwave transmission intensity" as used herein means the intensity of polarized microwave having a frequency arbitrarily selected from 12 to 13 GHz after being transmitted through a plastic film in the thickness direction at 23±2° C. as shown in FIG. 9. The polarized microwave transmission intensity is measured easily and in a short time with a molecular orientation meter MOA series available from Oji Keisokuki K.K.

Figure 3:
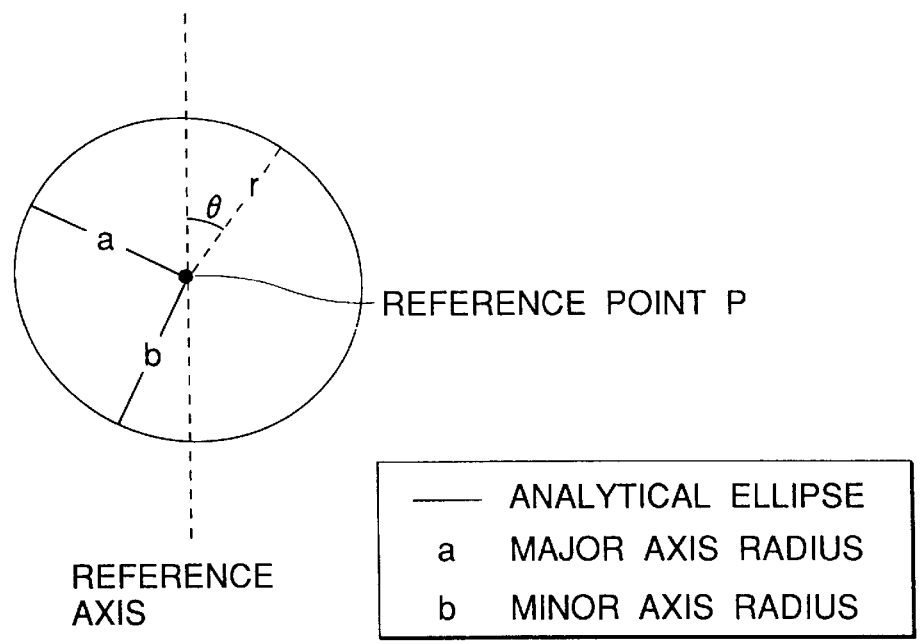
FIG. 3 illustrates the plot on polar coordinates depicting a polarized microwave transmission intensity of a plastic film.

Similarly to the heat shrinkage rate ellipse of FIG. 1, the polarized microwave transmission intensity ellipse is drawn on polar coordinates in accordance with the following method, an example of which is shown in FIG. 3. In FIG. 3 plots (hollow circles) are not shown because the change in the angle θ is continuous.

A reference point P is arbitrarily set on the surface of a plastic film, and a reference axis passing through the reference point P is drawn in an arbitrary direction. Polarized microwaves are transmitted through the reference point P in the thickness direction, and the intensity of the transmitted microwaves is measured. Taking the measured value as the distance r from the point P, the distance r is plotted on the direction of the angle θ. Measurement and plotting are repeated at varied angles θ formed between the reference axis and the direction of the electrical field of the polarized microwaves. The averages of plots at each angle are connected to draw an analytical ellipse round the reference point P.

When the eccentricity of the polarized microwave transmission intensity ellipse is 0.55 or smaller, preferably 0.45 or smaller, the resulting flexible printed circuit exhibits satisfactory dimensional accuracy, and a faulty connection to other electronic components such as connectors is effectively prevented from occurring.

To the contrary, if a plastic film having the eccentricity exceeding 0.55 is used, the film has a large in-plane variation in heat shrinkage rate so that the resulting flexible printed circuit has poor dimensional accuracy, causing faulty connections at a high frequency.

The eccentricity of the ultrasonic wave propagation rate ellipse or the polarized microwave transmission ellipse of plastic films is usually measured before laminating the plastic films. Because the eccentricity of these ellipses is hardly affected by laminating, the measurement could be made on a plastic film stripped off a flexible printed circuit produced.

The flexible printed circuit according to the present invention is a laminate of a plastic film and a conducting layer. A biaxially stretched plastic film is preferably used. The stretch ratio is usually 1.05 to 10, preferably 1.2 to 9 in the machine direction (MD) and 1.2 to 9 in the transverse direction (TD). The MD/TD stretch ratio is preferably 7/10 to 10/7.

The plastic film must have a heat shrinkage rate ellipse whose eccentricity is not greater than 0.7 and preferably has an ultrasonic wave propagation rate ellipse whose eccentricity is not greater than 0.4 or a polarized microwave transmission intensity ellipse whose eccentricity is not greater than 0.55. In the case of a plastic film having been stretched biaxially, the eccentricities of the heat shrinkage rate ellipse, the ultrasonic wave propagation rate ellipse, and the polarized microwave transmission intensity ellipse are constant in the machine direction as shown in FIG. 8(A), whereas they vary in the transverse direction, showing a minimum at the center and a maximum at both ends as shown in FIG. 8(B). Accordingly, in using a biaxially stretched film, it is necessary that the eccentricity of the heat shrinkage rate ellipse be not greater than 0.7 at both ends in the transverse direction, and it is preferable that the eccentricity of the ultrasonic wave propagation rate ellipse and that of the polarized microwave transmission intensity ellipse be not greater than 0.4 and not greater than 0.55, respectively, at both ends in the transverse direction.

The plastic film used in the manufacture of flexible printed circuits is usually prepared separately. In some cases, a film-forming plastic material is applied directly on a metal foil as a conducting layer and caused to polymerize into a film.

Examples of useful materials of the plastic film include polyimide, polyether nitrile, polyether sulfone, polyethylene terephthalate, polyethylene naphthalate, and polyvinyl chloride. The plastic film preferably has an elastic modulus of not less than 300 kg/mm$^2$, a linear expansion coefficient of not more than $3 \times 10^{-5}$/°C., and a glass transition temperature of not lower than 70° C. Of the above-mentioned plastic materials, polyethylene terephthalate, polyethylene naphthalate, and polyimide are preferred from total considerations of heat resistance, dimensional stability, electric characteristics, mechanical strength, chemical resistance, and cost. The plastic film usually has a thickness of 0.01 to 0.3 mm, preferably 0.025 to 0.125 mm.

The metals useful as a conducting layer include copper, gold, stainless steel, aluminum, nickel, and alloys of these metals. Taking softness, workability, electric characteristics., and cost into consideration,, copper and copper alloys are preferred. The metallic conductor circuit usually has a thickness of 0.002 to 0.100 mm, preferably 0.005 to 0.070 mm. The conductor circuit usually has a modulus of elasticity of 2000 to 20000 kg/mm$^2$, preferably 4000 to 12000 kg/mm$^2$, as measured as a foil. The modulus of elasticity can be measured with a tensile tester (Tensilon Tester) in accordance with ASTM D-882-83. When the elastic modulus of a metallic conductor circuit or a metallic thin film is to be measured after laminating or pattern formation, elements other than the metallic circuit or metal thin film are removed by plasma etching or excimer laser etching, and only the metallic circuit or metal thin film is subjected to the above-described measurement.

Laminating of a plastic film and a conducting layer are usually carried out with an adhesive. Examples of suitable adhesives include thermosetting adhesives (e.g., epoxy rubber adhesives and polyester adhesives comprising a polyester resin having added thereto an isocyanate hardening agent), thermoplastic adhesives (e.g., synthetic rubber adhesives), and adhesive agents (pressure-sensitive adhesives, e.g., acrylic adhesives). Thermosetting adhesives are preferred of them for their satisfactory performance in terms of adhesion, heat resistance, wet heat resistance, workability, and durability.

The process for producing the flexible printed circuit of the present invention will be described taking for instance the laminate structure shown in FIG. 6(B).

Two plastic films 2 and 4 are prepared. Polyimide films are used for preference. These plastic films must satisfy the condition that the eccentricity of the heat shrinkage rate ellipse as obtained by the above-described method be not greater than 0.7. It is desirable for the plastic films to have an ultrasonic wave propagation rate ellipse having an eccentricity of not greater than 0.4 as obtained by the above-described method and/or to have a polarized microwave transmission intensity ellipse having an eccentricity of not greater than 0.55 as obtained by the above-described method. Use of plastic films having such small anisotropy in heat shrinkage as specified in the present invention leads to elimination of faulty connections of a flexible printed circuit to other electronic components such as connectors.

As shown in FIG. 4(A), an adhesive layer 6 is formed on a plastic base film 4. The adhesive layer 6 is provided by applying an adhesive to the plastic film 4 followed by drying or sticking an adhesive layer formed on a release sheet onto the plastic film 4 and stripping the release sheet. The adhesive layer 6 usually has a thickness of 0.003 to 0.2 mm, preferably 0.005 to 0.05 mm. A conducting layer 3a is then formed on the adhesive layer 6. For example, a metal foil, e.g., a copper foil, is put on the adhesive layer 6 and adhered thereto by roll application. The conducting layer 3a can also be formed by electroplating or sputtering. In this case, the adhesive layer 6 is unnecessary, and the conducting layer 3a is formed directly on the plastic film 4. The conducting layer 3a is subjected to patterning by a conventional technique, such as a printing process, a subtractive process or an additive process to form the conductor circuit 3 as shown in FIG. 4(B).

Figure 4C:
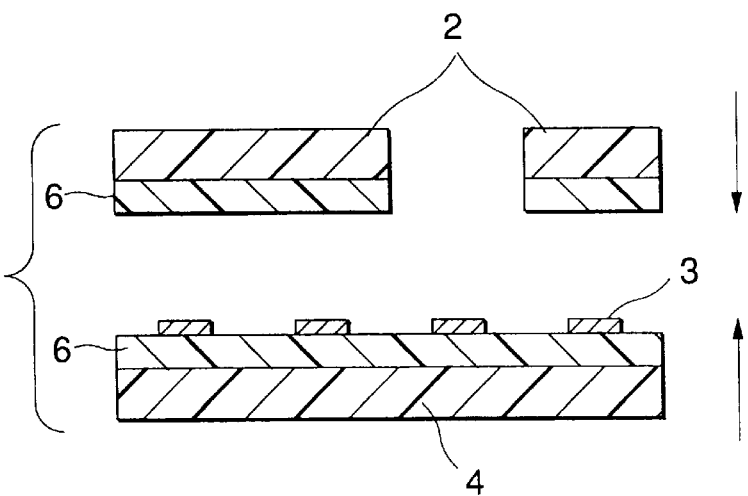

Separately, the adhesive layer 6 is formed on the plastic film 2 for covering. The resulting plastic film 2 having the adhesive layer 6 and the plastic film 4 having the conductor circuit 3 are laminated with the adhesive layer 6 of the former and conductor circuit side of the latter facing each other as shown in FIG. 4(C).

Figure 4D:
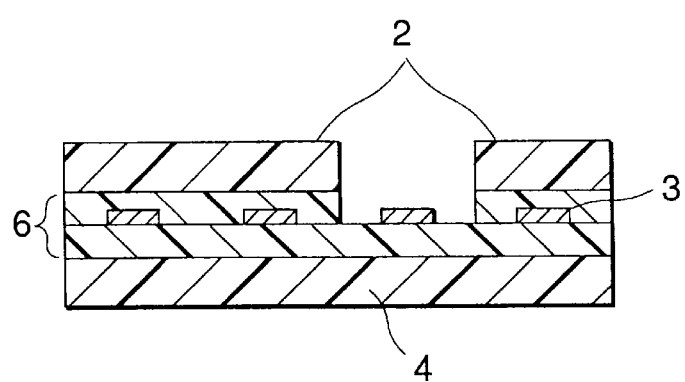

The two plastic films are bonded by pressing under heat (pressure bonding) or temporarily bonding by means of a roller followed by application of heat and/or pressure. There is thus produced the flexible printed circuit shown in FIG. 4(D) or FIG. 6(B). The method and conditions of laminating are selected appropriately according to the kinds of the plastic film and the adhesive.

Figure 5:
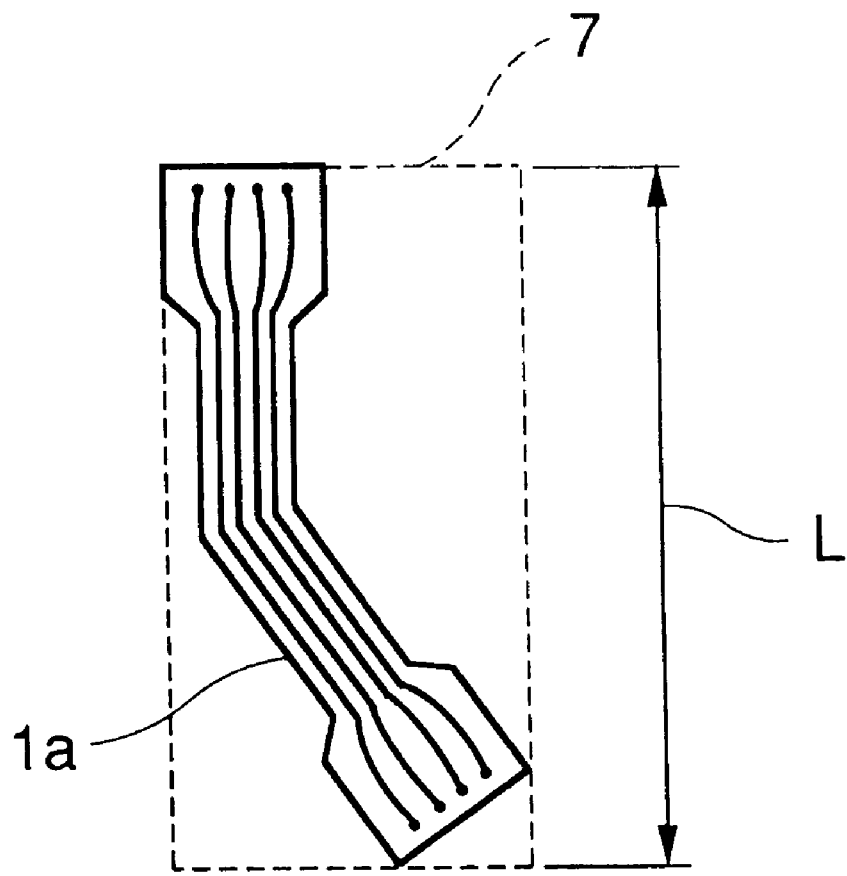
FIG. 5 shows a flexible printed circuit having a bent form.

The thickness of the flexible printed circuit is usually 50 to 800 μm, preferably 100 to 600 μm, while depending on its use, and the like. The shape of the flexible printed circuit is not particularly limited, and the flexible printed circuit can have various shapes, inclusive of a bent form as shown in FIG. 5, in conformity with usage. The size is not limited, either. For example, the minimum circumscribed quadrilateral of the flexible printed circuit has a long side length L of 10 to 1000 mm, preferably 30 to 600 mm (see FIG. 5).

The present invention will now be illustrated in greater detail with reference to Examples and Comparative Examples, but it should be understood that the invention is not construed as being limited thereto. FIG. 4 is referred to.

EXAMPLE 1

A 0.025 mm thick-biaxially stretched polyimide stock film roll (lot No. 1) and another lot (lot No. 2) of the same kind were prepared.

The heat shrinkage rate, ultrasonic wave propagation rate, and polarized microwave transmission intensity of these stock films were measured to obtain their ellipses according to the above-described methods, and the eccentricity of each ellipse was calculated. The eccentricity was obtained for 20 points of measurement in the transverse direction (TD) inclusive of both ends. The results of measurement are shown below.

|  | Lot No. 1 | Lot No. 2 |
| --- | --- | --- |
| Heat Shrinkage rate Ellipse |  |  |
| Maximum | 0.658 | 0.669 |
| Minimum | 0.457 | 0.450 |
| Average | 0.568 | 0.575 |
| Standard Deviation | 0.068 | 0.072 |
| Ultrasonic Wave Propagation Rate Ellipse |  |  |
| Maximum | 0.346 | 0.353 |
| Minimum | 0.229 | 0.222 |
| Average | 0.291 | 0.295 |
| Standard Deviation | 0.040 | 0.042 |
| Polarized Microwave Transmission Intensity Ellipse | 0.485 | 0.493 |
| Maximum | 0.362 | 0.356 |

-continued

|  | Lot No. 1 | Lot No. 2 |
| --- | --- | --- |
| Minimum | 0.424 | 0.427 |
| Average | 0.042 | 0.045 |
| Standard Deviation |  |  |

A cover film 2 of 250×120 mm was cut out of the polyimide stock film roll of lot No. 1, and a base film 4 of the same size was cut out of the polyimide stock film roll of lot No. 2.

An epoxy type thermosetting adhesive was applied to the surface of the cover film 2 and dried to form an adhesive layer 6 having a thickness of 0.015 mm. An epoxy type thermosetting adhesive was applied to the surf ace of the base film 4 and dried to form the adhesive layer 6 having a thickness of 0.025 mm.

A copper foil 3a having a thickness of 0.035 mm was put on the adhesive layer 6 of the base film 4 and bonded by rolling at a roller surface temperature of 120° C. The copper foil 3a was etched by a subtractive process to form a printed circuit 3 as shown in FIG. 4(B). Films 2 and 4 were laminated with the adhesive layer 6 while the adhesive side of the film 2 and the circuit side of the film 4 facing each other as shown in FIG. 4(C) by pressure bonding under conditions of 150° C.×1 hour×30 kg/cm² to prepare a flexible printed circuit having the structure of FIG. 4(D).

The plastic cover film 2 and the plastic base film 4 were stripped off the resulting flexible printed circuit, and the in-plane anisotropy of heat shrinkage of each film was evaluated in the same manner as described above. The results were substantially equal to those for the respective stock films. That is, the eccentricity of the heat shrinkage rate ellipse was not greater than 0.7, that of the ultrasonic wave propagation rate ellipse was not greater than 0.4, and that of the polarized microwave transmission ellipse was not greater than 0.55.

The dimensions of 21000 finished flexible printed circuits thus produced were measured to find that none of them showed a dimensional distortion of 0.15 mm or greater from the specification.

COMPARATIVE EXAMPLE 1

A polyimide stock film roll of the same kind as used in Example 1 but of different production lot (lot No. 3) was prepared,, and the eccentricity each of the characteristic ellipses was obtained in the same manner as in Example 1. The results obtained were as follows.
Heat Shrinkage Rate Ellipse:
  Maximum=0.908; Minimum=0.502; Average=0.719;
  Standard Deviation=0.123
Ultrasonic Wave Propagation Rate Ellipse:
  Maximum=0.561; Minimum=0.252; Average=0.399;
  Standard Deviation=0.093
Polarized Microwave Transmission Intensity Ellipse:
  Maximum=0.827; Minimum=0.383; Average=0.567;
  Standard Deviation=0.134

A cover film 2 of 250×120 mm was cut out of the polyimide stock film roll of lot No. 3, and a base film 4 of the same size-was cut out of the polyimide stock film roll of lot No. 1 used in the Example 1. And flexible printed circuits having a structure shown in FIG. 4(C) were manufactured by the same manner of the Example 1.

On measuring the dimensions, 2054 out of 21000 flexible printed circuits thus produced suffered a dimensional distortion of 0.15 mm or greater from the specification, and 39 out of the 2054 flexible printed circuits showed a dimensional distortion of 0.18 mm or greater.

As described above, the flexible printed circuit of the present invention and the process for producing them according to the present invention are characterized in that the plastic film used therein exhibits a heat shrinkage rate ellipse having an eccentricity within a specific range. Because the in-plane anisotropy of heat shrinkage of such a plastic film is thus reduced, the resulting flexible printed circuit has improved dimensional accuracy and is thereby free from poor connections to other electronic components such as connectors.

While the invention has been described in detail and with reference to specific examples thereof, it will be apparent to one skilled in the art that various changes and modifications can be made therein without departing from the spirit and scope thereof. For example, the present invention also can be applied to an ordinary composite sheet not only to the flexible printed circuit. The composite sheet according to the present invention may be also applied to IC card, credit card or the like.

What is claimed is:

1. A composite sheet comprising:
    a plastic film; and
    a conducting layer;
    wherein said plastic film has a heat shrinkage rate ellipse having an eccentricity of not more than 0.7.

2. The composite sheet according to claim 1, wherein the heat shrinkage rate ellipse is defined by a reference axis in a stretching direction of said plastic film and a reference point arbitrarily set on the reference axis, and the heat shrinkage rate ellipse is a set of distances from the reference point, representing magnitudes of heat shrinkage rates of said plastic film in directions having a measurement angle θ with respect to the reference axis.

3. The composite sheet according to claim 2, wherein said plastic film is a biaxially stretched film.

4. A composite sheet comprising:
    a plastic film; and
    a conducting layer;
    wherein said plastic film has an ultrasonic wave propagation rate ellipse having an eccentricity of not more than 0.4.

5. The composite sheet according to claim 4, wherein the ultrasonic wave propagation rate ellipse is defined by a reference point arbitrarily set on said plastic film and a reference axis passing through the reference point in an arbitrary direction on said plastic film, and the ultrasonic wave propagation rate ellipse is a set of distances from the reference point, representing magnitudes of ultrasonic wave propagation rates of said plastic film in directions having a measurement angle θ with respect to the reference axis.

6. The composite sheet according to claim 5, wherein said plastic film is a biaxially stretched film.

7. A composite sheet comprising:
    a plastic film; and
    a conducting layer;
    wherein said plastic film has a polarized microwave transmission intensity ellipse having an eccentricity of not more than 0.55.

8. The composite sheet according to claim 7, wherein the polarized microwave transmission intensity ellipse is defined by a reference point arbitrarily set on said plastic film and a reference axis passing through the reference point in an arbitrary direction on said plastic film, and the polarized microwave transmission intensity ellipse is a set of distances from the reference point, representing magnitudes of polarized microwave transmission intensities of said plastic film in directions of electrical fields of a polarized microwaves having a measurement angle θ with respect to the reference axis.

9. The composite sheet according to claim 5, wherein said plastic film is a biaxially stretched film.

\* \* \* \* \*